United States Patent [19]

Tanaka et al.

[11] 4,456,998
[45] Jun. 26, 1984

[54] SEMICONDUCTOR LASER

[75] Inventors: Fujio Tanaka; Yasuyuki Okamura; Yukitoshi Kushiro, all of Tokyo; Chuichi Ota, Fuchu; Shigeyuki Akiba, Tokyo, all of Japan

[73] Assignee: Kokusai Denshin Denwa Kabushiki Kaisha, Tokyo, Japan

[21] Appl. No.: 266,610

[22] Filed: May 22, 1981

[30] Foreign Application Priority Data

Jun. 2, 1980 [JP] Japan ................................ 55-72744
Jun. 2, 1980 [JP] Japan ................................ 55-72745
Jun. 2, 1980 [JP] Japan ................................ 55-72746
Jun. 2, 1980 [JP] Japan ................................ 55-72747

[51] Int. Cl.³ .............................................. H01S 3/19
[52] U.S. Cl. .................................. 372/45; 372/46; 357/17
[58] Field of Search .................. 372/45, 46; 357/16, 357/17

[56] References Cited

U.S. PATENT DOCUMENTS 4,329,660 5/1982 Yano et al. ........................ 372/46
4,340,966 7/1982 Akiba et al. ...................... 372/45

FOREIGN PATENT DOCUMENTS 2432785 4/1980 France ............................ 372/46
55-91894 7/1980 Japan ............................. 372/45

Primary Examiner—William L. Sikes
Attorney, Agent, or Firm—Robert E. Burns; Emmanuel J. Lobato; Bruce L. Adams

[57] ABSTRACT

A semiconductor laser, which comprises a substrate of InP, an active layer, and two clad layers holding therebetween the active layer, and which is constructed so that the refractive index of the active layer may be larger than the refractive indexes of the two clad layers. In one of the two clad layers, the refractive index of a region adjacent to a radiation region in the active layer is larger than the refractive index of a region adjacent to a non-radiation region in the active layer. The refractive index of the other clad layer is equal to the refractive index of that region of said on clad layer adjoining the radiation region or the non-radiation region. The thickness and width of the radiation region of the active layer are selected so that the semiconductor laser may oscillate in the fundamental transverse mode. A buffer layer may be further provided between the active layer and one of the two clad layers.

4 Claims, 27 Drawing Figures

SEMICONDUCTOR LASER

BACKGROUND OF THE INVENTION

The present invention relates to a semiconductor junction laser which employs an InP substrate, and more particularly to a semiconductor junction laser structure for fundamental transverse mode oscillation.

For continuous oscillation of a semiconductor laser at room temperature, use must be made of a laser structure which confines an injected current and light energy within a radiation region of the active layer. To this end, a stripe electrode type semiconductor laser was proposed in which its electrode is stripe-shaped to prevent the injected current from flowing into other portions than the radiation region. However, this conventional semiconductor laser has a drawback such that even if the stripe is narrowed, the injected current path widens in the active layer to provide an insufficient current confinement effect, making the fundamental transverse mode oscillation impossible.

To overcome this defect, a buried hereto (hereinafter referred to simply as BH) type semiconductor laser was proposed.

However, this laser element has such defects as follows: Firstly, the active layer once obtained by crystal growth is also subjected to etching. By this etching, the InGaAsP is exposed in either side wall of the active layer and it is not clear how this exposed portion is grown by the second crystal growth; it is considered naturally that lattice defects are liable to occur in such an interface. This is a problem which must be solved for enhancement of reliability. Another defect is a technical difficulty in appreciable reductions of the thickness and width of the active layer which are required for the fundamental transverse mode oscillation because of too large a difference between the refractive indexes of the active layer and the surrounding InP layers, i.e. 3.51 and 3.17. Moreover, even if this problem could be solved, there would be posed another drawback of small light output. In fact, the light output obtainable with the existing BH arrangement is as small as several to ten-odd milliwatts.

BRIEF SUMMARY OF THE INVENTION

An object of the present invention is to provide a semiconductor laser which utilizes, for the confinement of light, the difference between mode progagation constants (effective refractive indexes) of the radiation region and the non-radiation region instead of the difference between their physical refractive indexes, thereby to eliiminate the defects of the prior art buried hetero type semiconductor laser, and which is, therefore, highly reliable and oscillates in the fundamental transverse mode.

To attain the above object of this invention, there is provided a semiconductor laser whch comprises a substrate of InP, an active layer, and two clad layers holding therebetween the active layer and which is constructed so that the refractive index of the active layer may be larger than the refractive indexes of the two clad layers, characterized in that, in one of the two clad layers, the refractive index of a region adjacent to a radiation region in the active layer is larger than the refractive index of a region adjacent to a non-radiation region in the active layer; the refractive index of the other clad layer is equal to the refractive index of that region of said one clad layer adjoining the radiation region or the non-radiation region; and the thickness and width of the radiation region of the active layer are selected so that the semiconductor laser may oscillate in the fundamental transverse mode. A buffer layer may be further provided between the active layer and one of the two clad layers.

BRIEF DESCRIPTION OF THE DRAWINGS

The invention will be described in detail below with reference to the accompanying drawings, in which.

DETAILED DESCRIPTION

To make differences between prior arts and the present invention clear, an example of prior arts will first be described.

Figure 1:
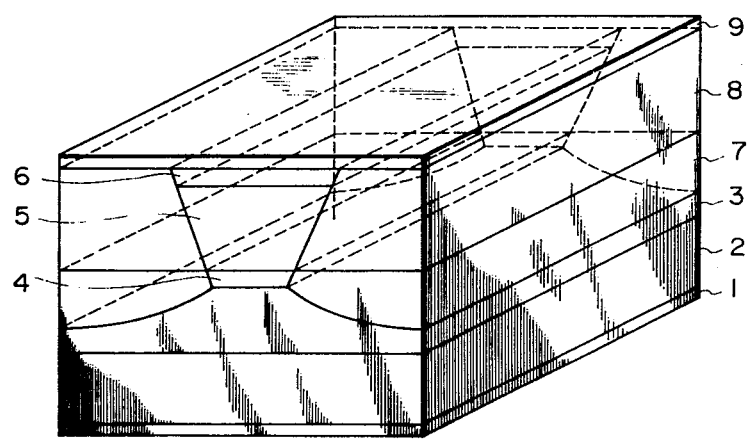
FIG. 1 is a perspective view of a conventional buried hetero type semiconductor laser.

FIG. 1 shows the structure of the BH type semiconductor laser. In FIG. 1, reference numeral 1 indicates an n-side ohmic electrode; 2 designates an n-InP substrate; 3 identifies an n-InP layer; 4 denotes an InGaAsP active layer; 5 represents a p-InP layer; 6 shows a p-InGaAsP layer for forming a p-type ohmic contact; 7 refers to p-InP layers; 8 indicates n-InP layers; and 9 designates a p-side ohmic contact.

When a forward bias voltage is applied to this BH type semiconductor laser, making the electrode 1 negative relative to the electrode 9, a current is injected only to the active layer through the p-InGaAsP layer 6 and the p-InP layer 5 because the layers 7 and 8 form a reverse p-n junction of InP. Further, since the layers 3, 5, 7 and 8 surrounding the active layer 4 are formed of InP, there is a sufficient refractive index difference resulting from a difference between their materials, by which is obtained a complete light confinement effect, markedly improving the stripe electrode type semiconductor laser.

The manufacture of this BH type semiconductor laser starts with successive formation of the abovesaid layers 3, 4, 5 and 6 by liquid phase epitaxy on the n-InP substrate [crystal orientation (1, 0, 0)]. After this first crystal growth, a $SiO_2$ film is formed by the CVD method on the p-InGaAsP layer 6 in FIG. 1 and both side portions thereof corresponding to the layers 7 and 8 are selectively removed by chemical etching using the $SiO_2$ film as a mask, thereby to form a mesa. Then, by the second crystal growth, the above-said layers 7 and 8 are grown and the electrodes 1 and 9 are vapor-deposited thereon, thus producing the semiconductor laser.

The present invention will hereinafter be described in detail.

Figure 2:
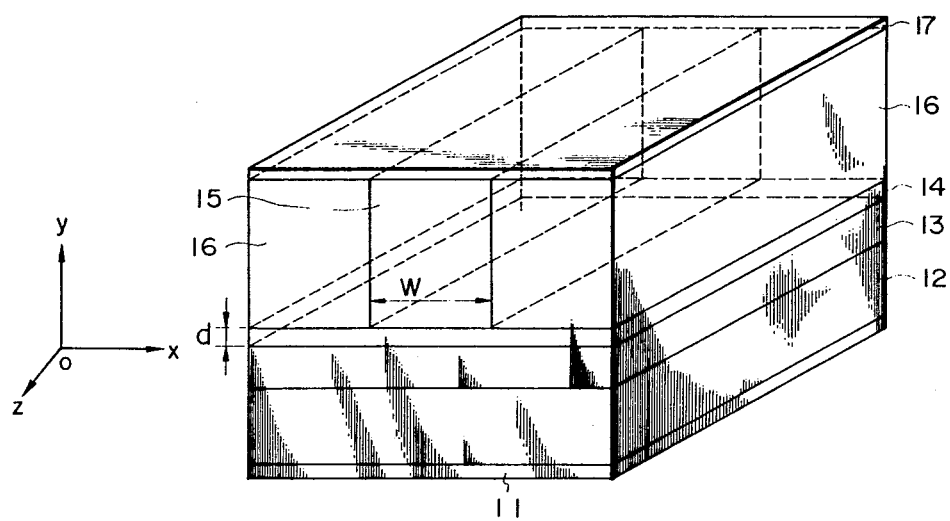
FIG. 2 is a perspective view of a transverse mode control type semiconductor laser which is an embodiment of the present invention.

FIG. 2 is a schematic diagram illustrating an embodiment of the present invention. A description will be given of its construction. In FIG. 2, reference numeral 11 indicates an n-side ohmic electrode; 12 designates an n-InP substrate; 13 identifies an n-$Ga_\gamma In_{1-\gamma} As_\delta P_{1-\delta}$ layer; 14 denotes a $Ga_\alpha In_{1-\alpha} As_\beta P_{1-\beta}$ active layer; 15 represents a p-$Ga_\gamma In_{1-\gamma} As_\delta P_{1-\delta}$ layer; 16 shows n-InP layer; and 17 refers to a p-side ohmic electrode. The following will explain the refractive index distribution in this structure and the fundamental transverse mode oscillation.

Consider such x, y and z co-ordinates as shown in FIG. 2 and let the thickness of the active layer 14 in the y-direction and the width of the p-$Ga_\gamma In_{1-\gamma} As_\delta P_{1-\delta}$ layer 15 in the x-direction be represented by values d and W, respectively. If the compositions $\alpha$, $\beta$, $\gamma$ and $\delta$ of the $Ga_\alpha In_{1-\alpha} As_\beta P_{1-\beta}$ active layer 14 and the $Ga_\gamma In_{1-\gamma} As_\delta P_{1-\delta}$ layers 13 and 15 are determined within the range of $0 < \delta < \beta < 1$ so that their refractive indexes $n_{14}$, $n_{13}$ and $n_{15}$ may be $n_{14} > n_{13} = n_{15}$ and by $\delta = 2.197\gamma$ and $\beta = 2.197\alpha$ in accordance with the lattice matching condition, and if the refractive index of the InP layer 16 is represented by $n_{16}$, then the refractive indexes bear such relationship that $n_{16} < n_{13} = n_{15} < n_{14}$. By a suitable selection of values d and W under the condition that the refractive indexes of the respective layers bear such a relationship, as described later, the semiconductor laser preforms the fundamental mode oscillation of zeroth degree.

Figure 3:
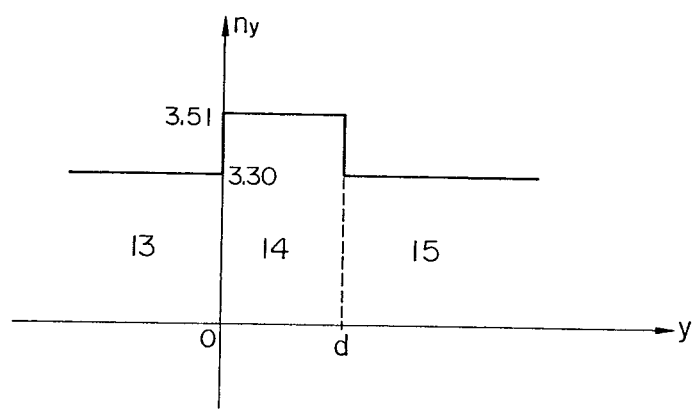
FIG. 3 is a diagram showing the refractive index distribution in the radiation region in the embodiment of the present invention.
Figure 4:
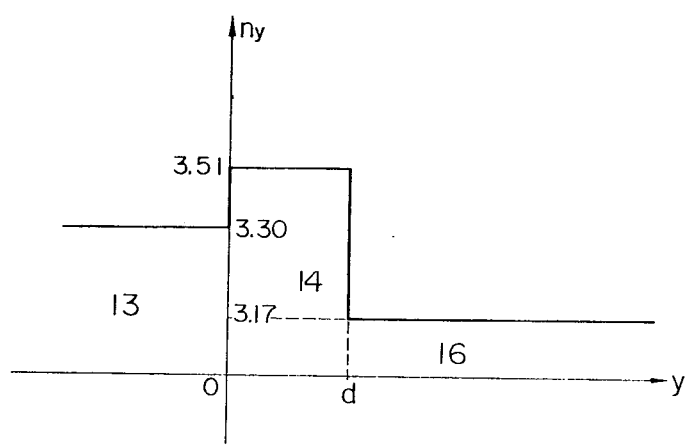
FIG. 4 is a diagram showing the refractive index distribution in the non-radiation region in the embodiment of the present invention.

At first, the value d is determined assuming that the oscillation wavelength is, for example, 1.55 μm. For instance, if $\delta = 0.36 < \beta = 0.88$, then the refractive index of the $Ga_{0.4}In_{0.6}As_{0.88}P_{0.12}$ active layer 14 is 3.51, the refractive indexes of the $Ga_{0.16}In_{0.84}As_{0.36}P_{0.64}$ layers 13 and 15 are 3.30 and the refractive index of the InP layer 16 is 3.17. In this case, if the thickness of the $Ga_{0.16}In_{0.84}As_{0.36}P_{0.64}$ layer 13 is about several μm or more in view of its skin depth, then the refractive index of the InP substrate 12 has substantially no affect on the mode propagation constant. Then, the refractive index distribution $n_y$ in the section in the y-axis direction in FIG. 2 becomes, in the radiation region, such as shown in FIG. 3 and, in the non-radiation region, such as depicted in FIG. 4.

Figure 5:
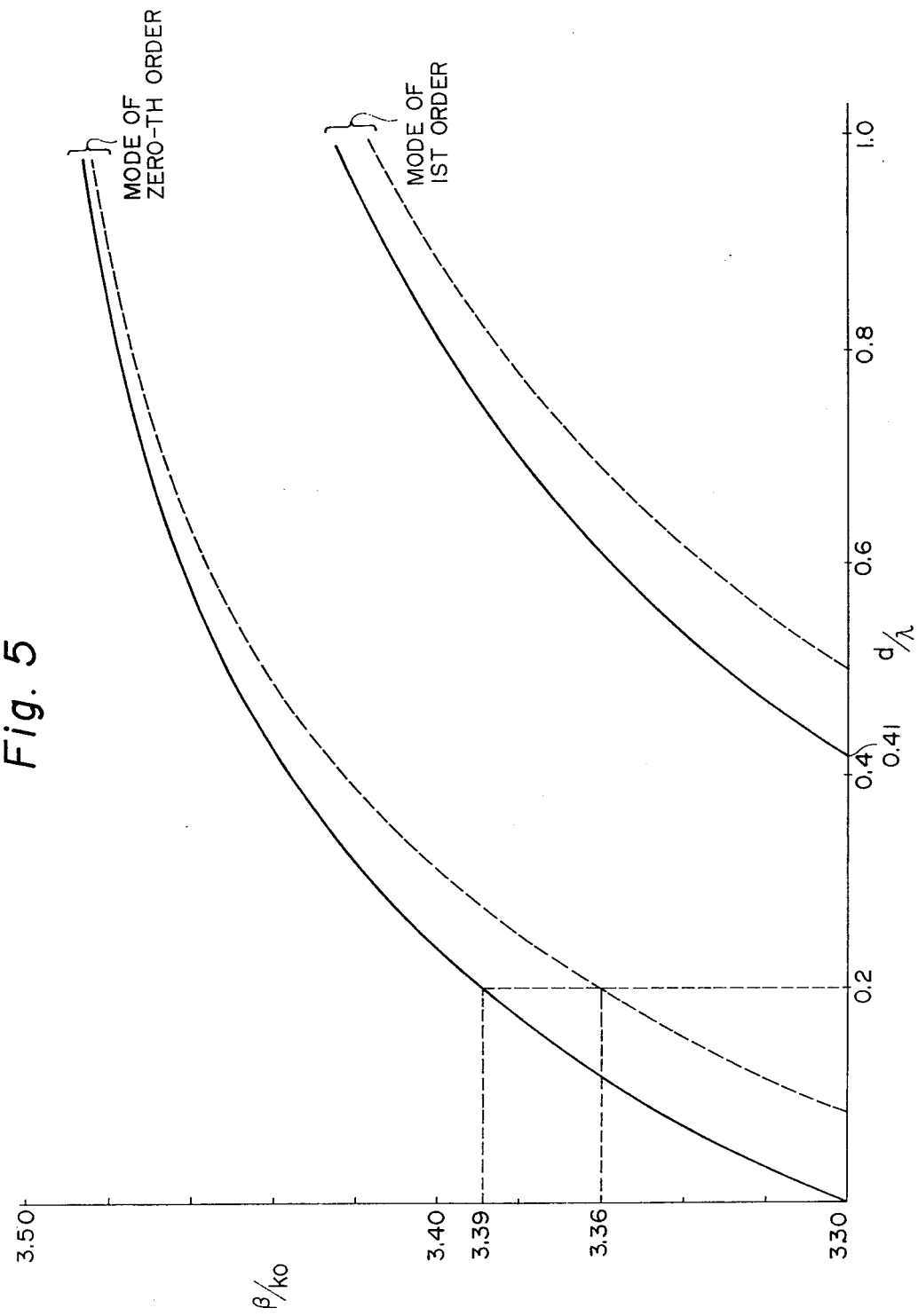
FIG. 5 shows mode variance curves for use in the present invention.

As a result of this, the semiconductor laser structure can be considered just like a dielectric slab type waveguide and such mode variance curves as shown in FIG. 5 are obtained. In FIG. 5, the abscissa is the value $d/\lambda$ obtained by dividing the thickness d of the active layer by the oscillation wavelength $\lambda$ and the ordinate is the effective refractive index $\beta/k_0$ obtained by dividing the propagation constant $\beta$ by $k_0 = 2\pi/\lambda$. In FIG. 5, the solid line portion is to mode present in the radiation region in the active layer and the broken line portion is the mode present in the non-radiation region in the active layer. As will be seen from FIG. 5, when $d/\lambda < 0.41$, it is only the fundamental mode of zeroth order that exists in the radiation and the non-radiation region, and the effective refractive index $\beta/k_0$ in the mode in the radiation region is always larger than that in the non-radiation region. That is, if $d/\lambda < 0.41$, then light of the fundamental mode can be imprisoned in the radiation region in the y direction.

Figure 6:
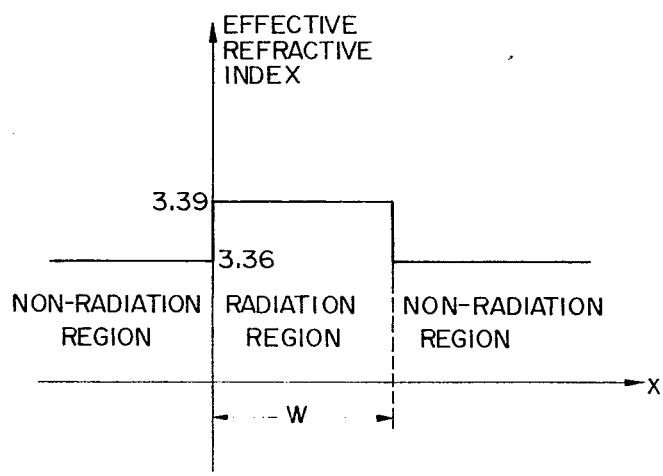
FIG. 6 is a diagram showing the effective refractive index distributions in the radiation region and the non-radiation region in the embodiment of the present invention.
Figure 7:
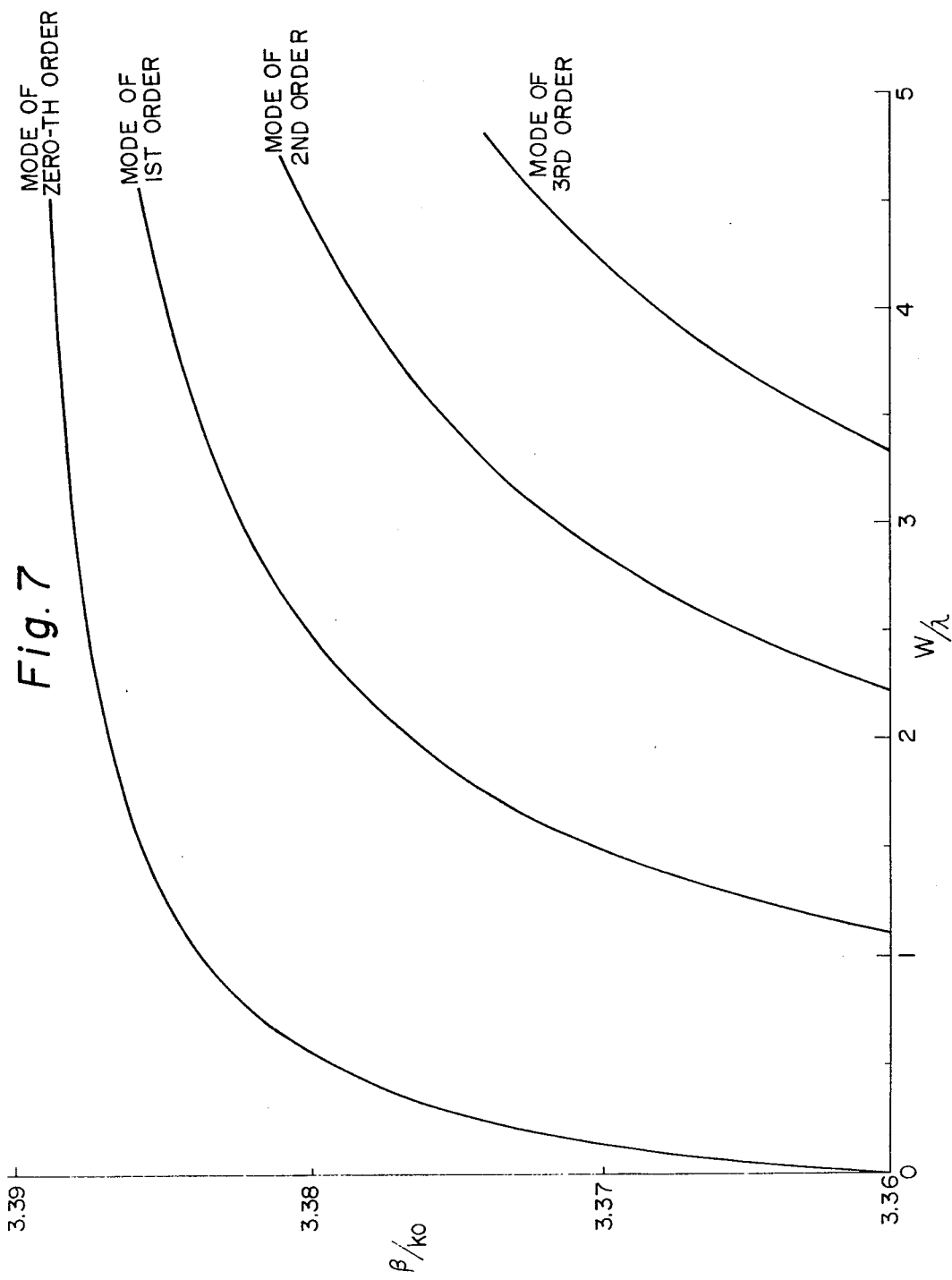
FIG. 7 shows mode variance curves in the radiation region for use in the present invention.

Next, the width W of the radiation region is determined. For example, in FIG. 5, assuming that $d/\lambda = 0.2$, that is, $d = 0.31$ μm, the effective refractive indexes of the radiation region (width W) and the non-radiation regions become 3.39 and 3.36, respectively. The distribution of the effective refractive indexes in the x-direction of the co-ordinate system shown in FIG. 2 is such as depicted in FIG. 6. Also in this case, such mode variance curves as shown in FIG. 7 can be obtained. In FIG. 7, $W/\lambda$ is a value obtained by dividing the width W of the radiation region by the oscillation wavelength $\lambda$. As is evident from FIG. 7, when $W/\lambda < 1.1$, that is, when $W < 1.71$ μm, only the mode of zeroth degree exists. Thus, by suitably determining values d and W from FIGS. 5 and 7 so that only the fundamental mode of zeroth degree exists, the semiconductor laser oscillates in the fundamental transverse mode without fail. In addition, since the values d and W can be made larger than those in the aforementioned BH structure, the present invention is advantageous in the light output and the light radiation pattern.

In the manufacture of the structure of FIG. 2, the aforesaid layers 13, 14 and 15 are sequentially formed, for example, by liquid phase epitaxy, on the InP substrate [crystal orientation (1, 0, 0)] 12. After this first crystal growth, portions corresponding to the layers 16 are removed as by plasma etching. In this case, the wall surface of the projecting portion of the layer 14 may form a mesa or inverted mesa according to the direction of the stripe-shaped layer 15.

By the second liquid phase growth the n-InP layers 16 are grown on the portions etched away as described above, and n-side ohmic electrode 11 and the p-side ohmic electrode 17 are vapor-deposited, obtaining the semiconductor laser of the present invention. When a forward bias to this semiconductor laser, making the electrode 17 positive relative to the electrode 11, since the layers 16 are n-type, a current is injected through the p-Ga$_{65}$In$_{1-\gamma}$As$_\delta$P$_{1-\delta}$ layer 15 into the underlying active layer 14, causing the laser to oscillate.

With such a semiconductor laser manufacturing method, since the interface of the radiation region in the active layer is not directly etched, there is no likelihood of occurrence of lattice defects, ensuring a highly reliable semiconductor laser.

Although in the foregoing an embodiment of the present invention has been described only in connection with the liquid phase epitaxy, exactly the same effects as described above can be obtained as well by vapor phase epitaxy or molecular beam epitaxy.

Further, even in the case where 11 is a p-side ohmic electrode, 12 a p-InP substrate, 13 a p-Ga$_\gamma$In$_{1-\gamma}$As$_\delta$P$_{1-\delta}$ layer, 14 a Ga$_\alpha$In$_{1-\alpha}$As$_\beta$P$_{1-\beta}$ active layer, 15 an n-Ga$_\gamma$I$_{1-\gamma}$As$_\delta$P$_{1-\delta}$ layer, 16 p-InP layer and 17 an n-side ohmic electrode, it is possible to obtain exactly the same effects as described above.

The embodiment of the present invention shown in FIG. 2 can be modified as follows: in which reference numeral 11 indicates an n-side ohmic electrode; 12 designates a n-InP substrate; 13 identifies an n-InP layer; 14 denotes a Ga$_\alpha$In$_{1-\alpha}$As$_\beta$P$_{1-\beta}$ active layer; 15 represents a p-Ga$_\gamma$In$_{1-\gamma}$As$_\delta$P$_{1-\delta}$ layer; 16 shows n-InP layer; and 17 refers to a p-side ohmic electrode. The following will explain the refractive index distribution in this structure and the fundamental transverse mode oscillation.

Consider such x, y and z co-ordinates as shown in FIG. 2 and let the thickness of the active layer 14 in the y-direction and the width of the p-Ga$_\gamma$In$_{1-\gamma}$As$_\delta$P$_{1-\delta}$ layer 15 in the x-direction be represented by d and W, respectively. If the compositions $\alpha$, $\beta$, $\gamma$ and $\delta$ of the Ga$_\alpha$In$_{1-\alpha}$As$_\beta$P$_{1-\beta}$ active layer 14 and the Ga$_\gamma$In$_{1-\gamma}$As$_\delta$P$_{1-\delta}$ layer 15 are determined within the range of $0<\delta<\beta<1$ so that their refractive indexes $n_{14}$ and $n_{15}$ may be $n_{14}>n_{15}$ and by $\delta=1.197\gamma$ and $\beta=2.197\alpha$ in accordance with the lattice matching condition, and if the refractive index of the InP layer 13 and 16 are represented by $n_{13}$ and $n_{16}$, then the refractive indexes bear such relationship that $n_{13}=n_{16}<n_{15}<n_{14}$. By a suitable selection of d and W under the condition that the refractive indexes of the respective layers bear such a relationship, as described later, the semiconductor laser preforms the fundamental mode oscillation of zeroth degree.

Figure 8:
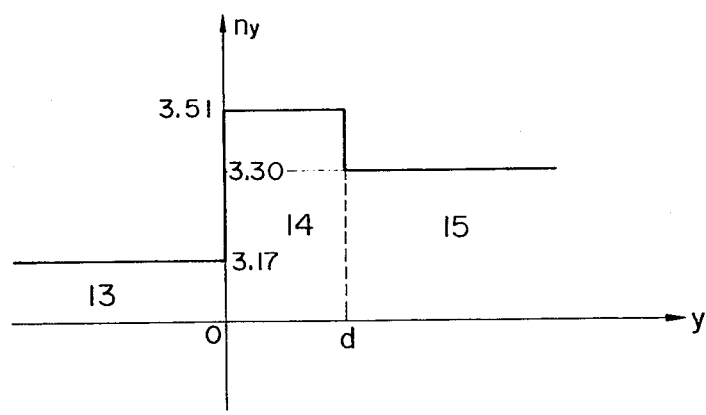
FIG. 8 is a diagram showing the refractive index distribution in the radiation region in the embodiment of the present invention.
Figure 9:
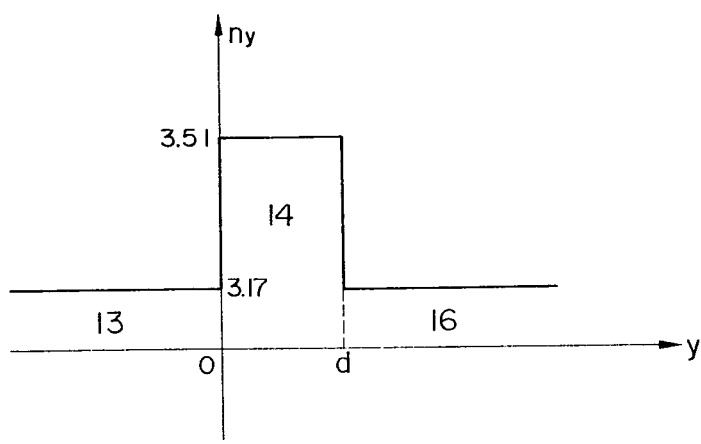
FIG. 9 is a diagram showing the refractive index distribution in the non-radiation region in the embodiment of the present invention.

At first, the value d is determined assuming that the oscillation wavelength is, for example, 1.55 $\mu$m. For instance, if $\delta=0.36<\beta=0.88$, then the refractive index of the Ga$_{0.4}$In$_{0.6}$As$_{0.88}$P$_{0.12}$ active layer 14 is 3.51, the refractive index of the Ga$_{0.16}$In$_{0.84}$As$_{0.36}$P$_{0.64}$ layer 15 is 3.30 and the refractive index of the InP layer 16 is 3.17. Then, the refractive index distribution $n_y$ in the section in the y-axis direction in FIG. 2 becomes, in the radiation region, such as shown in FIG. 8 and, in the non-radiation region, such as depicted in FIG. 9.

Figure 10:
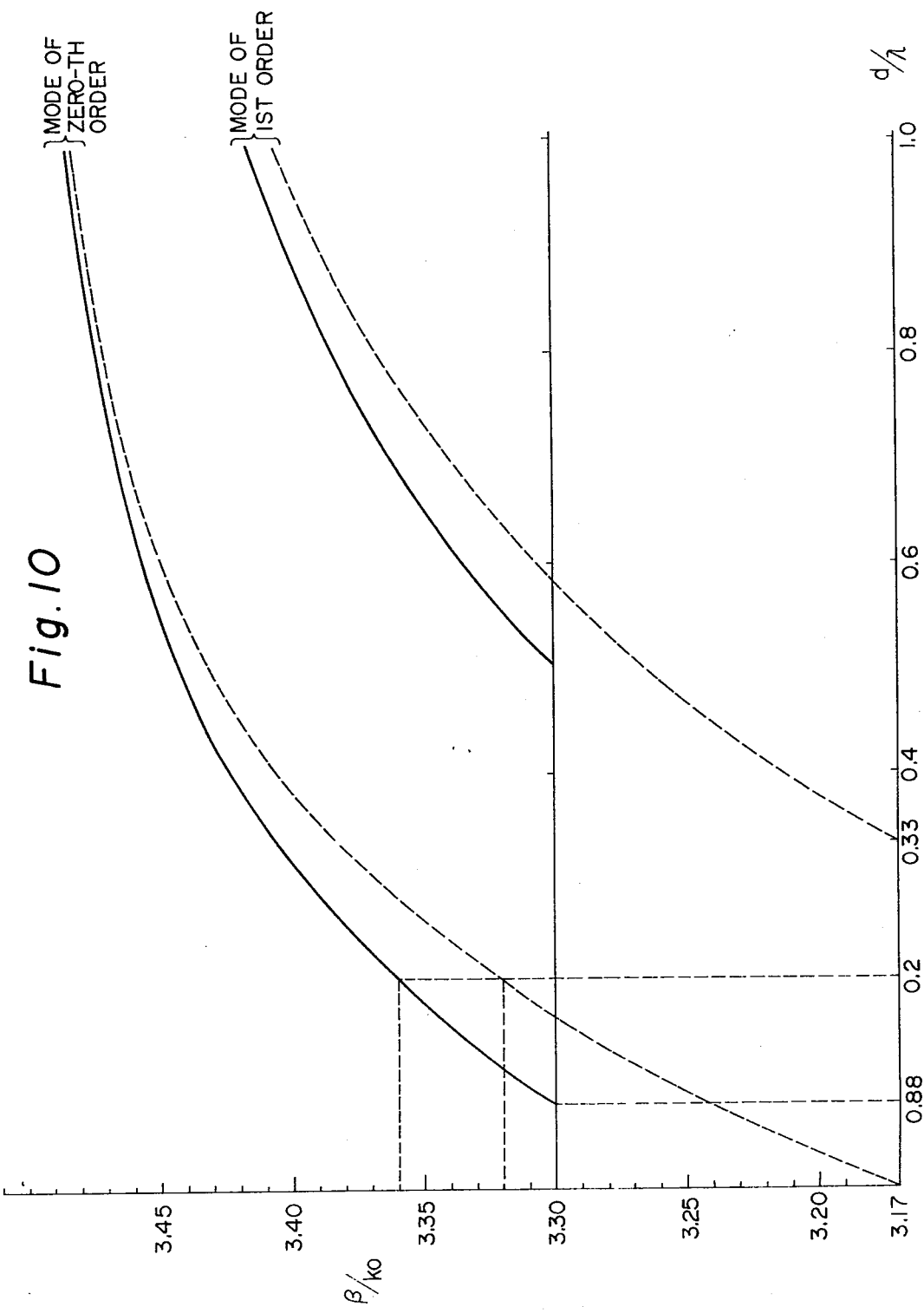
FIG. 10 shows mode variance curves for use in the present invention.

As a result of this, the semiconductor laser structure can be considered just like a dielectric slab type waveguide and such mode variance curves as shown in FIG. 10 are obtained. In FIG. 10 the abscissa is the value d/$\lambda$ obtained by dividing the thickness d of the active layer by the oscillation wavelength $\lambda$ and the ordinate is the effective refractive index $\beta/k_0$ obtained by dividing the propagation constant $\beta$ by $k_0=2\pi/\lambda$. In FIG. 10, the solid line portion is the mode present in the radiation region in the active layer and the broken line portion is the mode present in the non-radiation region in the active layer. As will be seen from FIG. 10, when $0.08<d/\lambda<0.33$ it is only the fundamental mode of zeroth order that exists in the radiation and the non-radiation region, and the effective refractive index $\beta/k_0$ in the mode in the radiation region is always larger than that in the non-radiation region. That is, if $0.08<d/\lambda<0.33$ then light of the fundamental mode can be imprisoned in the radiation region in the y-direction.

Figure 11:
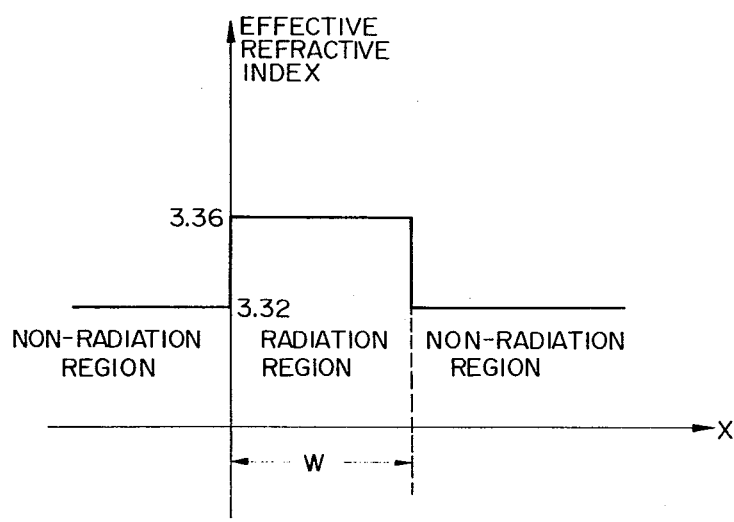
FIG. 11 is a diagram showing the effective refractive index distributions in the radiation region and the non-radiation region in the embodiment of the present invention.
Figure 12:
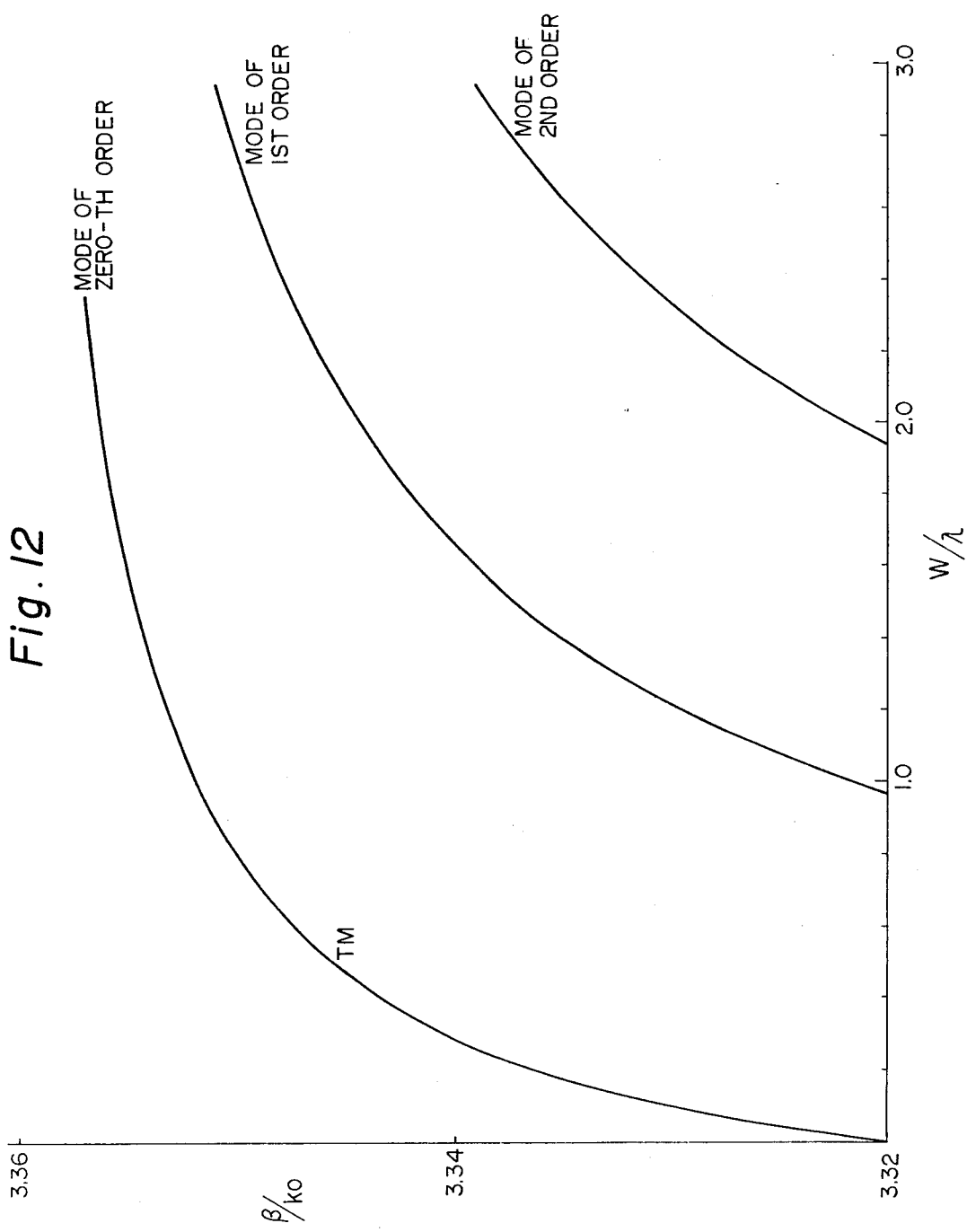
FIG. 12 shows mode variance curves in the radiation region for use in the present invention.

Next, the width W of the radiation region is determined. For example, in FIG. 10, assuming that d/$\lambda=0.2$, that is, $d=0.31$ $\mu$m, the effective refractive indexes of the radiation region (width W) and the non-radiation regions become 3.36 and 3.32, respectively. The distribution of the effective refractive indexes in the x-direction of the co-ordinate system shown in FIG. 2 is such as depicted in FIG. 11. Also in this case, such mode variance curves as shown in FIG. 12 can be obtained. In FIG. 12, W/$\lambda$ is a value obtained by dividing the width W of the radiation region by the oscillation wavelength $\lambda$. As is evident from FIG. 12, when W/$\lambda<1.0$, that is, when $W<1.55$ $\mu$m, only the mode of zeroth degree exists. Thus, by suitably determining values d and W from FIGS. 10 and 12 so that only the fundamental mode of zeroth degree exists, the semiconductor laser oscillates in the fundamental transverse mode without fail. In addition, since the values d and W can be made larger than those in the aforementioned BH structure, the present invention is advantageous in the light output and the light radiation pattern.

In the manufacture of the structure of FIG. 2, the aforesaid layers 13, 14 and 15 are sequentially formed, for example, by liquid phase epitaxy, on the InP substrate [crystal orientation (1, 0, 0)] 12. After this first crystal growth, portions corresponding to the layers 16 are removed as by plasma etching. In this case, the wall surface of the projecting portion of the layer 15 may form a mesa or inverted mesa according to the direction of the stripe-shaped layer 15.

By the second liquid phase growth the n-InP layers 16 and grown on the portions etched away as described above, and n-side ohmic electrode 11 and the p-side ohmic electrode 17 are vapor-deposited, obtaining the semiconductor laser of the present invention. When a forward bias to this semiconductor laser, making the electrode 17 positive relative to the electrode 11, since the layers 16 are n-type, a current is injected through the p-Ga$_\gamma$In$_{1-\gamma}$As$_\delta$P$_{1-\delta}$ layer 15 into the underlying active layer 14, causing the laser to oscillate.

Further, even in the case where 11 is a p-side ohmic electrode, 12 a p-InP substrate, 13 a p-InP layer, 14 a Ga$_\alpha$In$_{1-\alpha}$As$_\beta$P$_{1-\beta}$ active layer, 15 an n-Ga$_\gamma$I$_{1-\gamma}$As$_\delta$P$_{1-\delta}$ layer, 16 p-InP layers and 17 an n-side ohmic electrode, it is possible to obtain exactly the same effects as described above.

Figure 13:
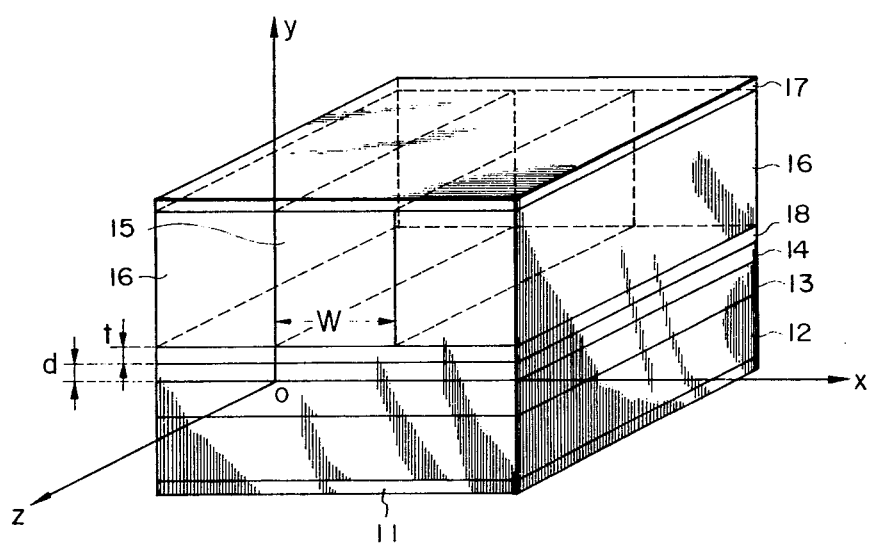
FIG. 13 is a perspective view of a transverse mode control type semiconductor laser which is an embodiment of the present invention.

When reference to FIG. 13, another example of the present invention will hereinafter be described in detail. In FIG. 13, reference numeral 11 indicates an negative ohmic electrode; 12 designates an n-InP substrate; 13 identifies an n-Ga$_\epsilon$In$_{1-\epsilon}$As$_\psi$P$_{1-\psi}$ layer; 14 denotes a Ga$_\alpha$In$_{1-\alpha}$As$_\beta$P$_{1-\beta}$ active layer; 18 represents a p-Ga$_\gamma$In$_{1-\gamma}$As$_\delta$P$_{1-\delta}$ layer which serves as a buffer layer for preventing what is called meltback; 15 shows a p-Ga$_\epsilon$In$_{1-\epsilon}$As$_\psi$P$_{1-\psi}$ layer; 16 refers to n-InP layers; and 17 indicates a positive ohmic electrode. The following will explain the refractive index distribution.

Consider such x, y and z co-ordinates as shown in FIG. 13 and let the thickness of the active layer 14 in the y-direction, the thickness of the Ga$_\gamma$In$_{1-\gamma}$As$_\delta$P$_{1-\delta}$ layer 18 in the y-direction and the width of the p-Ga$_\epsilon$In$_{1-\epsilon}$As$_\psi$P$_{1-\psi}$ layer 15 in the x-direction be represented by values d, t and W, respectively. If the compositions $\alpha$, $\beta$, $\gamma$, $\delta$, $\epsilon$ and $\psi$ of the Ga$_\alpha$In$_{1-\alpha}$As$_\beta$P$_{1-\beta}$ active layer 14, the Ga$_\gamma$In$_{1-\gamma}$As$_\delta$P$_{1-\delta}$ layers 18 and Ga$_\epsilon$In$_{1-\epsilon}$As$_\psi$P$_{1-\psi}$ layers 13 and 15 are determined within the range of $0 < \psi < \delta < \beta < 1$ so that their refractive indexes n$_{14}$, n$_{18}$, n$_{13}$ and n$_{15}$ may be n$_{14}$ > n$_{18}$ > n$_{15}$ = n$_{13}$ and by $\psi = 2.197\epsilon$, $\delta = 2.197\gamma$ and $\beta = 2.197\alpha$ in accordance with the lattice matching condition, and if the refractive index of the InP layer 16 is represented by n$_{16}$, then the refractive indexes bear such relationship tht n$_{16}$ < n$_{15}$ = n$_{13}$ < n$_{18}$ < n$_{14}$. By a suitable selection of values d, t and W under the condition that the refractive indexes of the respective layers bear such a relationship, as described later, the semiconductor laser preforms the fundamental transverse mode oscillation.

Figure 14:
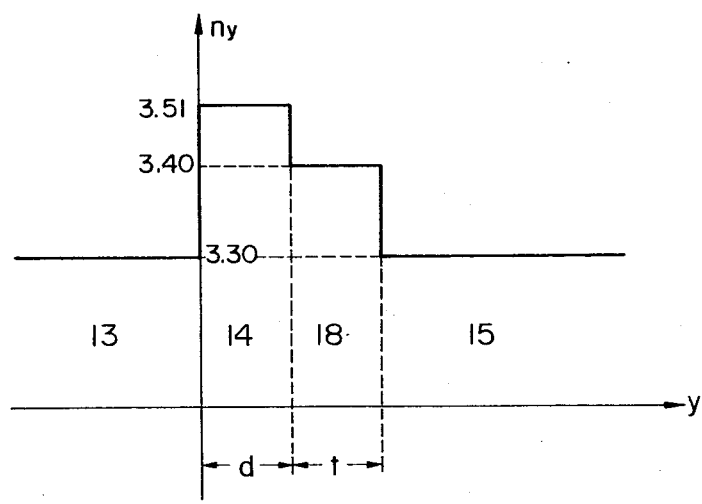
FIG. 14 is a diagram showing the refractive index distribution in the radiation region in the embodiment of the present invention.
Figure 15:
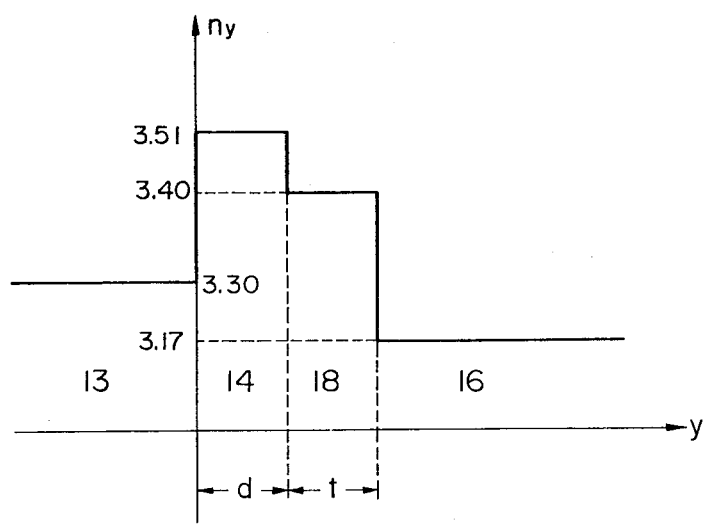
FIG. 15 is a diagram showing the refractive index distribution in the non-radiation region in the embodiment of the present invention.

At first, values d and t are determined assuming that the oscillation wavelength is, for example, 1.55 $\mu$m. For instance, if $\psi = 0.36 < \delta = 0.64 < \beta = 0.88$, then the refractive indexes of the Ga$_{0.16}$In$_{0.84}$As$_{0.36}$P$_{0.64}$ layers 13 and 15 are 3.30, the refractive index of the Ga$_{0.29}$In$_{0.71}$As$_{0.64}$P$_{0.36}$ layer 18 is 3.40, the refractive index of the Ga$_{0.4}$In$_{0.6}$As$_{0.88}$P$_{0.12}$ active layer 14 is 3.51 and the refractive index of the InP layer 16 is 3.17. In this case, if the thickness of the Ga$_{0.16}$In$_{0.84}$As$_{0.36}$P$_{0.64}$ layer 13 is about several $\mu$m or more in view of its skin depth, then the influence of the refractive index of the InP substrate 12 can be neglected. Then, the refractive index distribution in the section in the y-axis direction in FIG. 13 becomes, in the radiation region, such as shown in FIG. 14 and, in the non-radiation region, such as depicted in FIG. 15.

Figure 16:
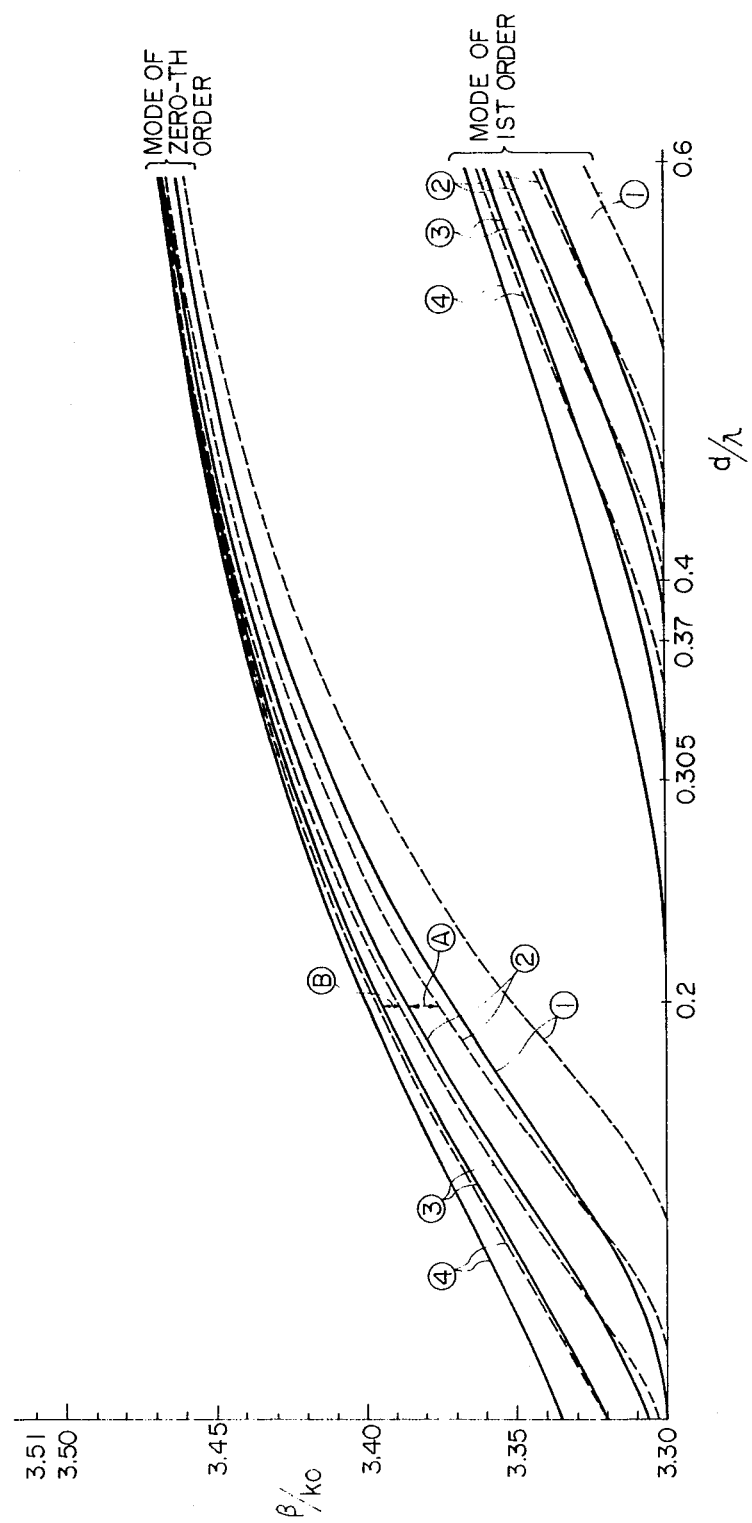
FIG. 16 shows mode variance curves in the embodiment of the present invention.

Considering the TE mode existing in a waveguide path of such a refractive index distribution, such mode variance surves as shown in FIG. 16 are obtained. In FIG. 16, the abscissa is a value d/$\lambda$ obtained by dividing the thickness d of the active layer by the oscillation wavelength and the ordinate is the effective refractive index $\beta/k_0$ obtained by dividing the propagation constant $\beta$ by $k_0 = 2\pi/\lambda$. In FIG. 16, the solid line portion is the mode present in the radiation region and the broken line portion is the mode present in the non-radiation region t/$\lambda$ obtained by dividing the thickness t of the Ga$_{0.29}$In$_{0.71}$As$_{0.64}$P$_{0.36}$ layer 18 by $\lambda$ is used as a parameter and curves corresponding to t/$\lambda$ = 0, 0.1, 0.2 and 0.3 are indicated by ①, ②, ③ and ④, respectively. For example, in the case of the curve ②, when d/$\lambda$ < 0.37, it is only the fundamental mode of zeroth order that exists in the radiation and the non-radiation region, and the $\beta/k_0$ in the mode in the radiation region is always larger than that in the non-radiation region. In the case of the curve ③, if d/$\lambda$ < 0.305, the same may be said of this case. That is, if d/$\lambda$ < 0.37 when t/$\lambda$ = 0.1 and if d/$\lambda$ < 0.305 when t/$\lambda$ = 0.2, then light of the fundamental mode can be imprisoned in the radiation region in the y-direction.

Figure 17:
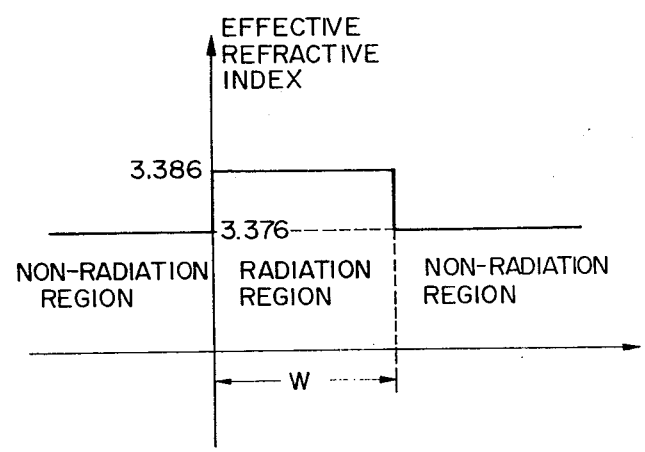
FIG. 17 is a diagram showing the effective refractive index distributions in the radiation region and the non-radiation region in FIG. 16.
Figure 18:
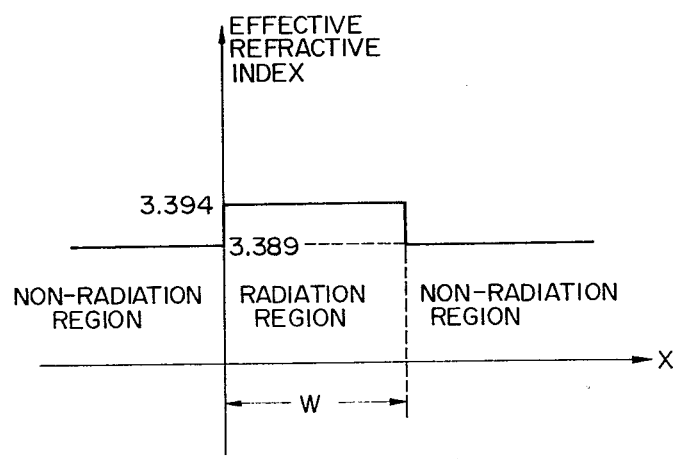
FIG. 18 is a diagram showing the effective refractive index distributions in the radiation region and the non-radiation region in FIG. 16.
Figure 19:
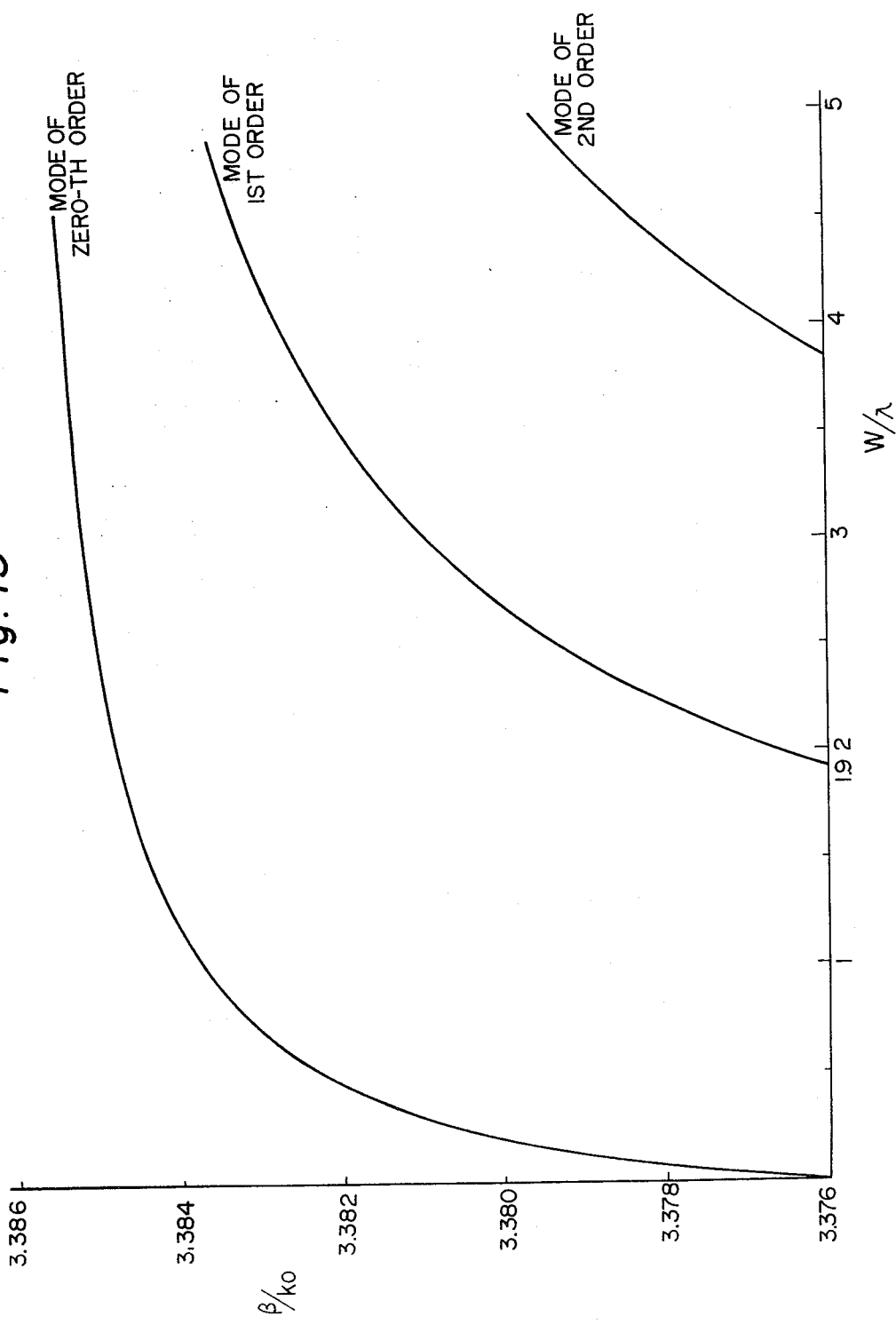
FIG. 19 shows mode variance curves corresponding to FIG. 17.
Figure 20:
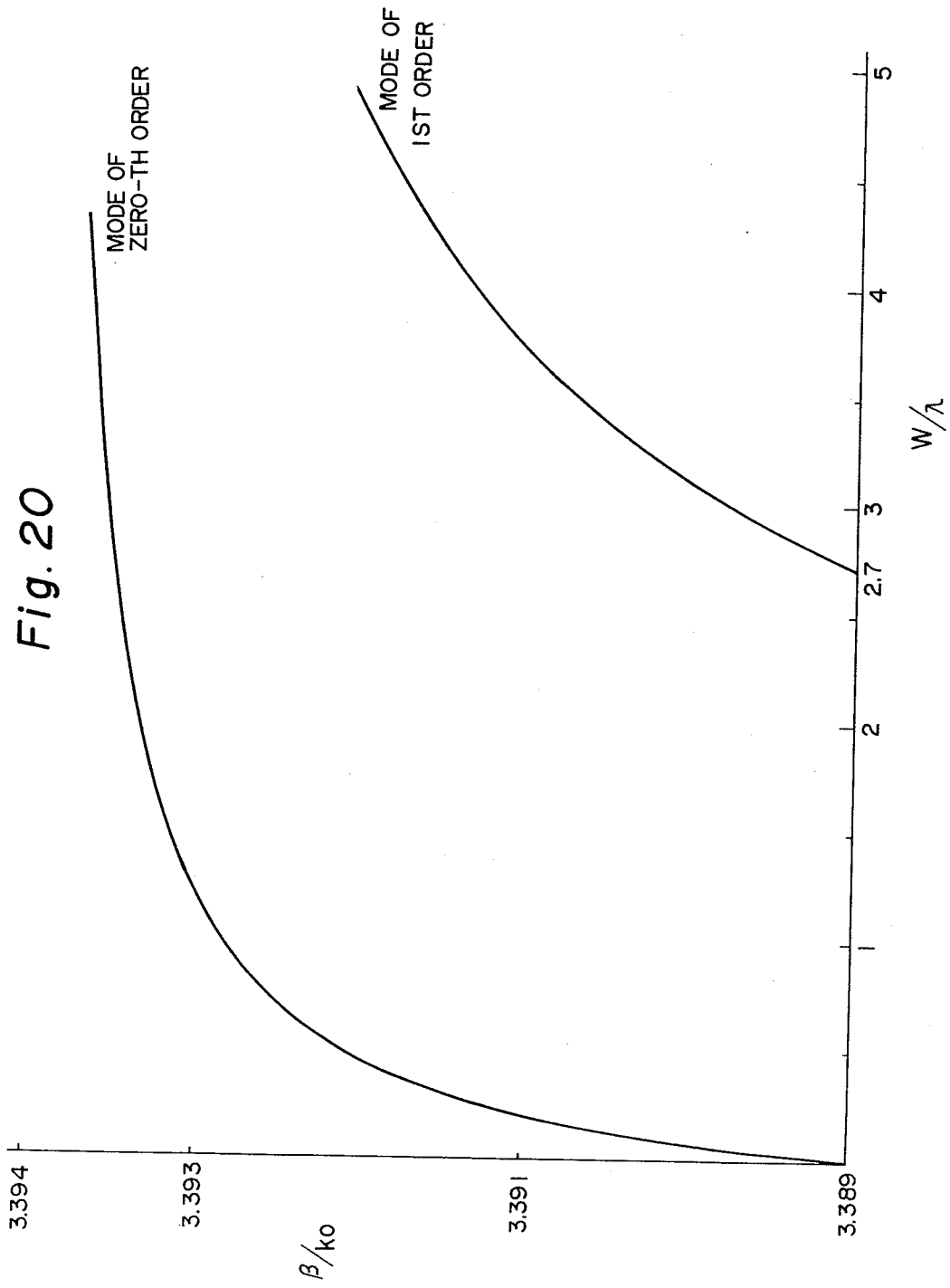
FIG. 20 shows mode variance curves corresponding to FIG. 18.

Next, the width W of the radiation region is determined. For example, in FIG. 16, assuming that d/$\lambda$ = 0.2, that is, d = 0.31 $\mu$m, and that t/$\lambda$ = 0.1, that is, t $\approx$ 0.16 $\mu$m, the effective refractive indexes of the radiation region (width W) and the non-radiation region become 3,386 and 3.376, respectively ( Ⓐ in FIG. 16). The distribution of the effective refractive indexes in the x-direction of the co-ordinate system shown in FIG. 13 is such as depicted in FIG. 17. Also in this case, such mode variance curves as shown in FIG. 19 can be obtained in the same manner as described previously. In FIG. 19, W/$\lambda$ is a value obtained by dividing the width W of the radiation region by the oscillation wavelength $\lambda$. As is evident from FIG. 19, when W/$\lambda$ < 1.9, that is, when W < 2.95 $\mu$m, only the mode of zeroth degree exists. Further, in a case where d = 0.31 $\mu$m and t/$\lambda$ = 0.2, that is, t = 0.31 $\mu$m, the effective refractive indexes of the radiation and non-radiation regions are respectively 3,394 and 3.389 from FIG. 16 ( Ⓑ ) and the distribution in the x-direction is such as shown in FIG. 18. Also in this case, mode variance curves such as depicted in FIG. 20 can be obtained in the same manner as described previously. In this case, if W/$\lambda$ < 2.7, that is, if W < 4.19 $\mu$m, only the fundamental mode of zeroth degree exists.

Thus, by suitably determining d, t and W so that only the fundamental mode of zeroth degree exists, the semiconductor laser can be obtained which oscillates in the fundamental transverse mode. In addition, since the values of d and W can be made larger than those in the aforementioned BH structure, the present invention is advantageous in the light output and the light radiation pattern.

In the manufacture of the structure of FIG. 13, the aforesaid layers 13, 14, 18 and 15 are sequentially formed, for example, by liquid phase epitaxy, on the InP substrate [crystal orientation (1, 0, 0)] 12. After this first crystal growth, portions corresponding to the layers 16 are removed as by plasma etching. In this case, the wall surface of the projecting portion of the layer 15 may form a mesa or inverted mesa according to the direction of the stripe-shaped layer 15. By the second liquid phase growth the n-InP layers 16 are grown on the portions etched away, and negative ohmic electrode 11 and the positive ohmic electrode 17 are vapor-deposited, obtaining the semiconductor laser of the present invention. When a forward bias to this semiconductor laser, making the electrode 18 positive relative to the electrode 11, since the layers 16 are n-type, a current is injected through the p-Ga$_\epsilon$In$_{1-\epsilon}$As$_\psi$P$_{1-\psi}$ layer 15 and the p-Ga$_\gamma$In$_{1-\gamma}$As$_\delta$P$_{1-\delta}$ layer 18 into the underlying active layer 14, causing the laser to oscillate. With such a semiconductor laser manufacturing method, since the interface of the active layer is not directly etched, there is no likelihood of occurrence of lattice defects, ensuring to offer a highly reliable semiconductor laser.

Further, even in a case where 11 is a positive ohmic electrode, 12 a p-InP substrate, 13 a p-Ga$_\epsilon$In$_{1-\epsilon}$As$_\psi$P$_{1-\psi}$ layer, 14 a Ga$_\alpha$In$_{1-\alpha}$As$_\beta$P$_{1-\beta}$ active layer, 18 a Ga$_\gamma$In$_{1-\gamma}$As$_\delta$P$_{1-\delta}$ layer, 15 an n-Ga$_\epsilon$In$_{1-\epsilon}$As$_\psi$P$_{1-\psi}$ layer, 16 p-InP layers and 17 a negative ohmic electrode, it is possible to obtain exactly the same effects as described above.

The embodiment shown in FIG. 13 can be modified as follows; in which reference numeral 11 indicates an negative ohmic electrode; 12 designates an n-InP substrate; 13 identifies an n-InP layer; 14 denotes a $Ga_\alpha In_{1-\alpha}As_\beta P_{1-\beta}$ active layer; 18 represents a $p\text{-}Ga_\gamma In_{1-\gamma}As_\delta P_{1-\delta}$ layer which serves as a buffer layer for preventing what is called melt-back; 15 shows a $p\text{-}Ga_\epsilon In_{1-\epsilon}As_\psi P_{1-\psi}$ layer; 16 refers to n-InP layers; and 17 indicates a positive ohmic electrode. The following will explain the refractive index distribution in this structure and the fundamental transverse mode oscillation.

Consider such x, y and z co-ordinates as shown in FIG. 13 and let the thickness of the active layer 14 in the y-direction, the thickness of the $Ga_\gamma In_{1-\gamma}As_\delta P_{1-\delta}$ layer 18 in the y-direction and the width of the $p\text{-}Ga_\epsilon In_{1-\epsilon}As_\psi P_{1-\psi}$ layer 15 in the x-direction be represented by values d, t and W, respectively. If the compositions $\alpha, \beta, \gamma, \delta, \epsilon$ and $\psi$ of the $Ga_\alpha In_{1-\alpha}As_\beta P_{1-\beta}$ active layer 14, the $Ga_\gamma In_{1-\gamma}As_\delta P_{1-\delta}$ layers 18 and $Ga_\epsilon In_{1-\epsilon}As_\psi P_{1-\psi}$ layer 15 are determined within the range of $0 < \psi < \delta < \beta < 1$ so that their refractive indexes $n_{14}$, $n_{18}$ and $n_{15}$ may be $n_{14} > n_{18} > n_{15}$ and by $\psi = 2.197\epsilon$, $\delta = 2.197\gamma$ and $\beta = 2.197\alpha$ in accordance with the lattice constant matching condition, and if the refractive index of the InP layers 13 and 16 are represented by $n_{13}$ and $n_{16}$, then the refractive indexes bear such relationship that $n_{13} = n_{16} < n_{15} < n_{18} < n_{14}$. By a suitable selection of d, t and W under the condition that the refractive indexes of the respective layers bear such a relationship, as described later, the semiconductor laser preforms the fundamental mode oscillation of zeroth degree.

Figure 21:
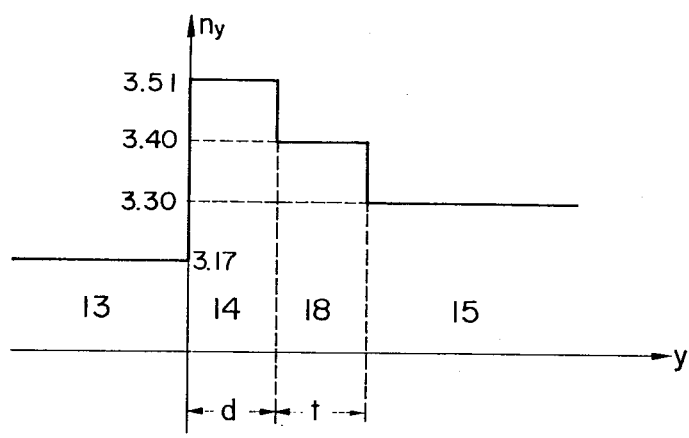
FIG. 21 is a diagram showing the refractive index distribution in the radiation region in the embodiment of the present invention.
Figure 22:
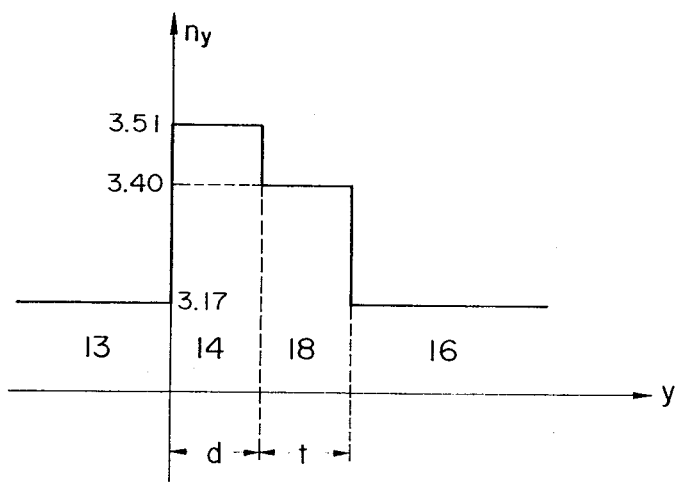
FIG. 22 is a diagram showing the refractive index distribution in the non-radiation region in the embodiment of the present invention.

At first, d and t are determined assuming that the oscillation wavelength is, for example, 1.55 $\mu$m. For instance, if $\delta = 0.36 < \delta = 0.64 < \beta = 0.88$, then the refractive indexes of the $Ga_{0.16}In_{0.84}As_{0.36}P_{0.64}$ layer and 15 is 3.30, the refractive index of the $Ga_{0.29}In_{0.71}As_{0.64}P_{0.36}$ layer 18 is 3.40, the refractive index of the $Ga_{0.4}In_{0.6}As_{0.88}P_{0.12}$ active layer 14 is 3.51 and the refractive index of the InP layers 13 and 16 are 3.17. Then, the refractive index distribution in the section in the y-axis direction in FIG. 13 becomes, in the radiation region, such as shown in FIG. 21 and, in the non-radiation region, such as depicted in FIG. 22.

Figure 23:
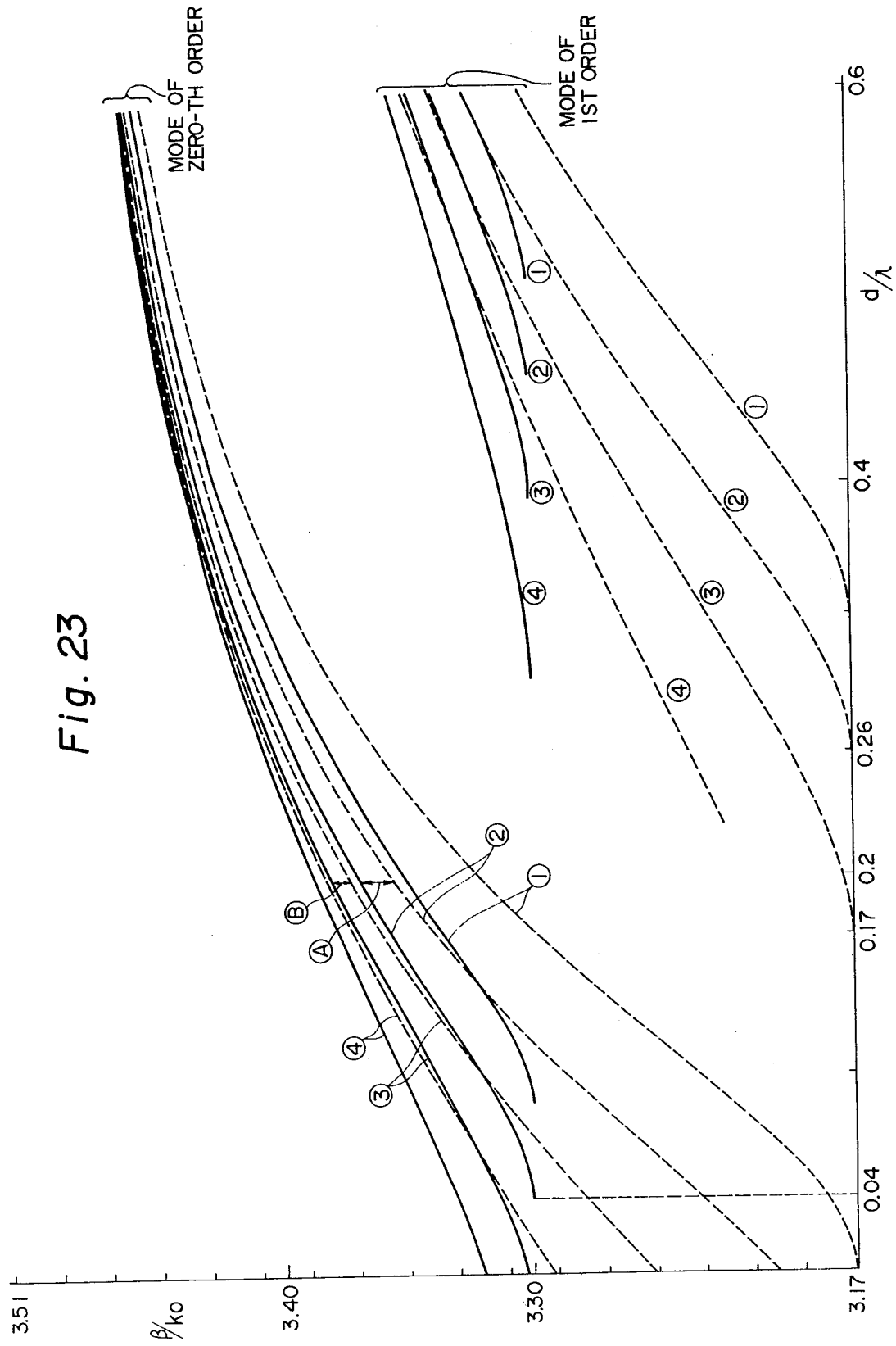
FIG. 23 shows mode variance curves in the embodiment of the present invention.

Considering the TE mode existing in a waveguide path of such a refractive index distribution, such mode variance surves as shown in FIG. 23 are obtained. In FIG. 23, the abscissa is a value $d/\lambda$ obtained by dividing the thickness d of the active layer by the oscillation wavelength and the ordinate is the effective refractive index $\beta/k_0$ obtained by dividing the propagation constant $\beta$ by $k_0 = 2\pi/\lambda$. In FIG. 23, the solid line portion is the mode present in the radiation region and the broken line portion is the mode present in the non-radiation region $t/\lambda$ obtained by dividing the thickness t of the $Ga_{0.29}In_{0.71}As_{0.64}P_{0.36}$ layer 18 by $\lambda$ is used as a parameter and curves corresponding to $t/\lambda = 0, 0.1, 0.2$ and 0.3 are indicated by ①, ②, ③ and ④, respectively. For example, in the case of the curve ②, when $0.04 < d/\lambda < 0.26$, it is only the fundamental mode of zeroth order that exists in the radiation and the non-radiation region, and the $\beta/k_0$ in the mode in the radiation region is always larger than that in the non-radiation region. In the case of the curve ③, if $d/\lambda < 0.17$, the same may be said of this case. That is, if $0.04 < d/\lambda < 0.26$ when $t/\lambda = 0.1$ and if $d/\lambda < 0.17$ when $t/\lambda = 0.2$, then light of the fundamental mode can be imprisoned in the radiation region in the y-direction.

Figure 24:
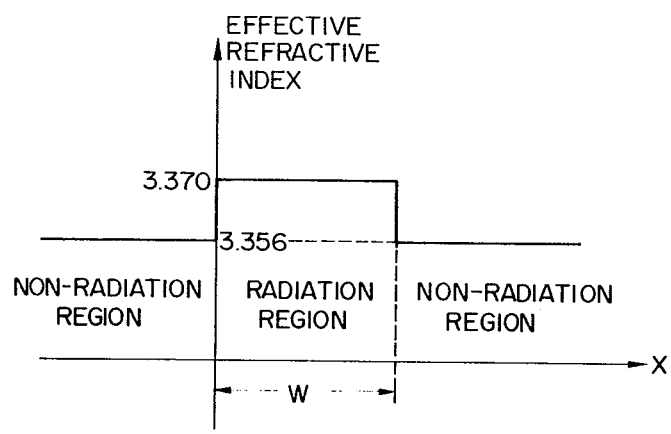
FIG. 24 is a diagram showing the effective refractive index distributions in the radiation region and the non-radiation region in FIG. 23.
Figure 25:
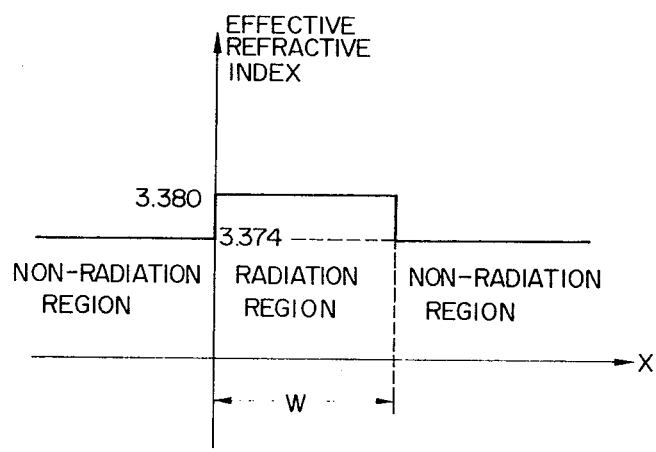
FIG. 25 is a diagram showing the effective refractive index distributions in the radiation region and the non-radiation region in FIG. 23.
Figure 26:
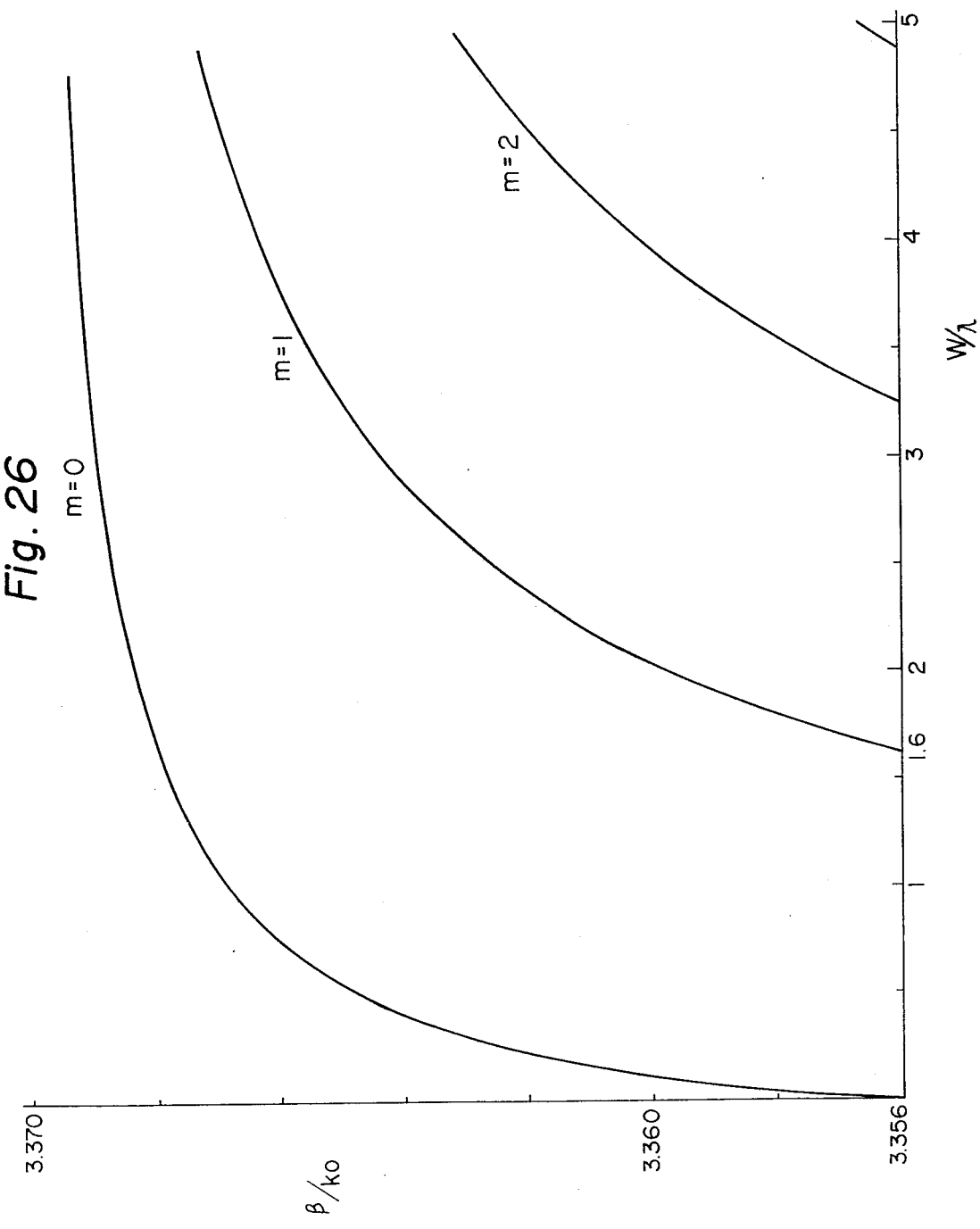
FIG. 26 shows mode variance curves corresponding to FIG. 24.
Figure 27:
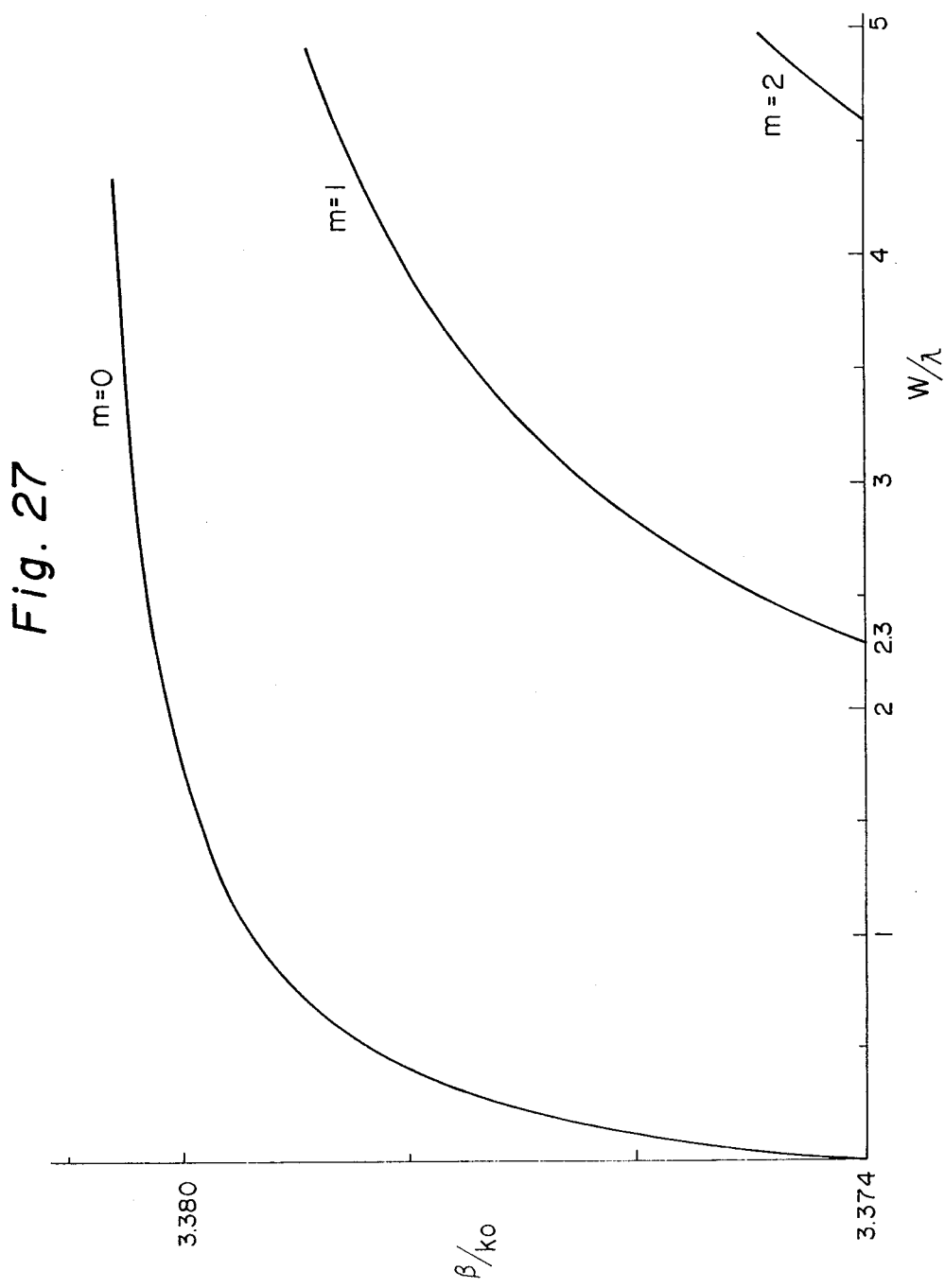
FIG. 27 shows mode variance curves corresponding to FIG. 25.

Next, the width W of the radiation region is determined. For example, in FIG. 23, assuming that $d/\lambda = 0.2$, that is, $d = 0.31$ $\mu$m, and that $t/\lambda = 0.1$, that is, $t \approx 0.16$ $\mu$m, the effective refractive indexes of the radiation region (width W) and the non-radiation region become 3,370 and 3.356, respectively (Ⓐ in FIG. 23). The distribution of the effective refractive indexes in the x-direction of the co-ordinate system shown in FIG. 13 is such as depicted in FIG. 24. Also in this case, such mode variance curves as shown in FIG. 26 can be obtained in the same manner as described previously. In FIG. 26, $W/\lambda$ is a value obtained by dividing the width W of the radiation region by the oscillation wavelength $\lambda$. As is evident from FIG. 26, when $w/\lambda < 1.6$, that is, when $W < 2.48$ $\mu$m, only the mode of zeroth degree exists. Further, in a case where $d = 0.31$ $\mu$m and $t/\lambda = 0.2$, that is, $t = 0.31$ $\mu$m, the effective refractive indexes of the radiation and non-radiation regions are respectively 3.381 and 3.374 from FIG. 23 (Ⓑ) and the distribution in the x-direction is such as shown in FIG. 25. Also in this case, mode variance curves such as depicted in FIG. 27 can be obtained in the same manner as described previously. In this case, if $W/\lambda < 2.3$, that is, if $W < 3.57$ $\mu$m, only the fundamental mode of zeroth degree exists.

Thus, by suitably determining d, t and W so that only the fundamental mode of zeroth degree exists, the semiconductor laser can be obtained which oscillates in the signal lateral mode. In addition, since the values d and W can be made larger than those in the aforementioned BH structure, the present invention is advantageous in the light output and the light radiation pattern.

In the manufacture of the structure of FIG. 13, the aforesaid layers 13, 14, 18 and 15 are sequentially formed, for example, by liquid phase epitaxy, on the InP substrate [crystal orientation (1, 0, 0)] 12. After this first crystal growth, portions corresponding to the layers 16 are removed as by plasma etching. In this case, the wall surface of the projecting portion of the layer 15 may form a mesa or inverted mesa according to the direction of the stripe-shaped layer 15. By the second liquid phase growth the n-InP layers 16 are grown on the portions etched away, and negative ohmic electrode 11 and the positive ohmic electrode 17 are vapor-deposited, obtaining the semiconductor laser of the present invention. When a forward bias to this semiconductor laser, making the electrode 18 positive relative to the electrode 11, since the layers 16 are n-type, a current is injected through the $p\text{-}Ga_\epsilon In_{1-\epsilon}As_\psi P_{1-\psi}$ layer 15 and the $p\text{-}Ga_\gamma In_{1-\gamma}As_\delta P_{1-\delta}$ layer 18 into the underlying active layer 14, causing the laser to oscillate. With such a semiconductor laser manufacturing method, since the interface of the active layer is not directly etched, there is no likelihood of occurrence of lattice defects, ensuring to offer a highly reliable semiconductor laser.

Further, even in a case where 11 is a positive ohmic electrode, 12 a p-InP substrate, 13 is a p-InP layer, 14 a $Ga_\alpha In_{1-\alpha}As_\beta P_{1-\beta}$ active layer, 18 a $Ga_\gamma In_{1-\gamma}As_\delta P_{1-\delta}$ layer, 15 an $n\text{-}Ga_\epsilon In_{1-\epsilon}As_\psi P_{1-\psi}$ layer, 16 p-InP layers and 17 a negative ohmic electrode, it is possible to obtain exactly the same effects as described above.

Although in the foregoing embodiments of the present invention have been described only in connection with the liquid phase epitaxy, exactly the same effects as described above can be obtained as well by vapor phase epitaxy or molecular beam epitaxy.

What we claim is:

1. In a semiconductor laser, a substrate of InP, an active layer of semiconductor, and two clad layers of semiconductor holding therebetween the active layer, and the refractive index of the active layer being larger than the refractive indexes of the two clad layers, characterized in that, one of the clad layers, has a region thereof adjoining a radiation region in the active layer and in which the retractive index is larger than the refractive index of a region of said one clad layer adjoining a non-radiation region in the active layer; the refractive index of the other clad layer being equal to the refractive index of said region of said one clad layer adjoining the radiation region; and the thickness and width of the radiation region of the active layer being selected so that the semiconductor laser oscillates in the fundamental transverse mode.

2. In a semiconductor laser a substrate of InP, an active layer of semiconductor, and two clad layers of semiconductor holding therebetween the active layer, and the refractive index of the active layer being larger than either of the refractive indexes of the two clad layers, characterized in that, one of the clad layers has a region adjoining a radiation region in the active layer and in which the refractive index is larger than the refractive index of a region adjoining a non-radiation region in the active layer; the refractive index of the other clad layer being equal to the refractive index of that region of said one clad layer adjoing the non-radiation region; and the thickness and width of the radiation region of the active layer being selected so that the semiconductor laser oscillates in the fundamental transverse mode.

3. In a semiconductor laser a first clad layer of semiconductor, an activer layer of semiconductor, a buffer layer and a second clad layer of semiconductor sequentially formed on an InP substrate and the refractive index of the active layer being larger than the refractive indexes of the other layers, characterized in that, the second clad layer has a region adjoining a radiation region in the active layer through the buffer layer and having a refractive index larger than the refractive index of a region adjoining a non-radiation region in the active layer through the buffer layer; the refractive index of the first clad layer being equal to the refractive index of that region of the second clad layer adjoining the radiation region through the buffer layer; and the thickness and width of the radiation region of the active layer are selected so that the semiconductor laser oscillates in the fundamental transverse mode.

4. In a semiconductor laser a first clad layer, an active layer of semiconductor, a buffer layer and a second clad layer of semiconductor sequentially formed on an InP substrate and the refractive index of the active layer being larger than the refractive indexes of the other layers, characterized in that, the second clad layer has a region adjoining a radiation region in the active layer through the buffer layer and having a refractive index larger than the refractive index of a region adjacent to a non-radiation region in the active layer through said buffer layer; the refractive index of the first clad layer being equal to the refractive index of that region of the second clad layer adjoining the non-radiation region through said buffer layer; and the thickness and width of the radiation region of the active layer are selected so that the semiconductor laser oscillates in the fundamental transverse mode.

* * * * *